United States Patent [19]

Sfarti et al.

[11] Patent Number: 4,773,044
[45] Date of Patent: Sep. 20, 1988

[54] ARRAY-WORD-ORGANIZED DISPLAY MEMORY AND ADDRESS GENERATOR WITH TIME-MULTIPLEXED ADDRESS BUS

[75] Inventors: Adrian Sfarti; Randy Goettsch, both of Sunnyvale, Calif.

[73] Assignee: Advanced Micro Devices, Inc, Sunnyvale, Calif.

[21] Appl. No.: 933,715

[22] Filed: Nov. 21, 1986

[51] Int. Cl.[4] .................... G06F 12/00; G06F 13/00
[52] U.S. Cl. .................................. 364/900; 365/238; 364/518
[58] Field of Search ............... 364/518, 200 MS File, 364/900 MS File; 365/238, 230

[56] References Cited

U.S. PATENT DOCUMENTS

| | | | |
|---|---|---|---|
| 4,183,058 | 1/1980 | Taylor | 358/127 |
| 4,395,700 | 7/1983 | McCubbrey et al. | 382/27 |
| 4,497,024 | 1/1985 | Roth | 364/414 |
| 4,593,642 | 9/1985 | Hansen | 364/900 |
| 4,608,678 | 8/1986 | Threewitt | 365/189 |
| 4,683,555 | 7/1987 | Pinkham | 364/215 |
| 4,691,295 | 9/1987 | Erwin et al. | 364/900 |
| 4,725,987 | 2/1988 | Cates | 365/220 |

*Primary Examiner*—Gary V. Harkcom
*Assistant Examiner*—Randy Lacasse
*Attorney, Agent, or Firm*—Warren M. Becker; J. Vincent Tortolano

[57] ABSTRACT

An array-word-organized memory system comprising a plurality of columns and rows of memory chips, an address bus routed through all of the memory chips, a plurality of selectable CAS lines wherein one of the CAS lines is routed through each one of said plurality of columns of memory chips and a plurality of selectable RAS lines wherein one of the RAS lines is routed through each one of said plurality of rows of memory chips. In operation, selected X and Y addresses are applied to the memory chips together with the strobing of selected ones of the CAS and RAS lines during four sequential time periods for addressing arbitrary arrays of pixels stored in the memory chips.

52 Claims, 11 Drawing Sheets

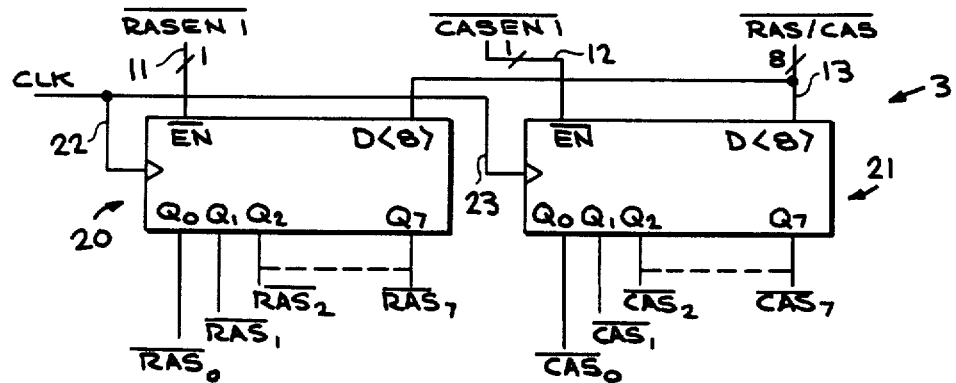
FIG. 2 ($NB_X = 1$, $NB_Y = 1$)
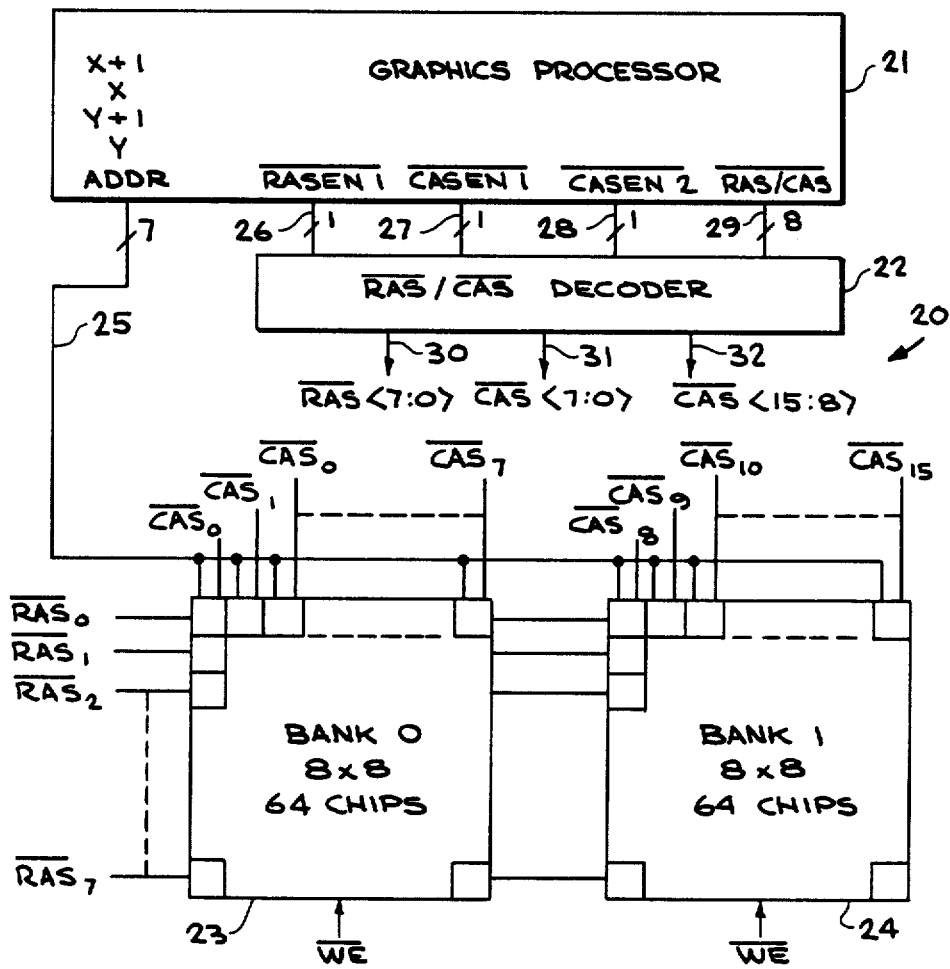
FIG. 3

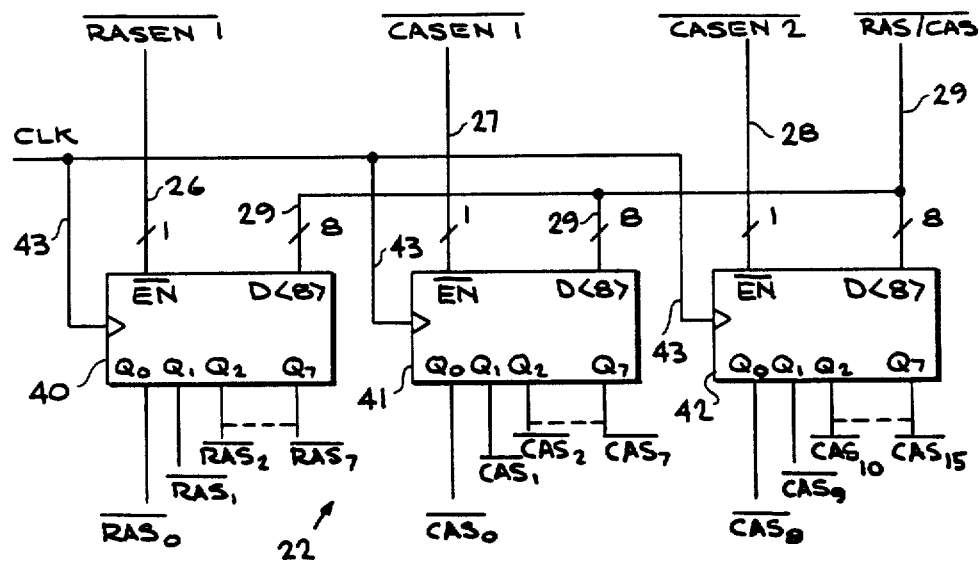
FIG. 4 ($NB_X = 2$, $NB_Y = 1$)
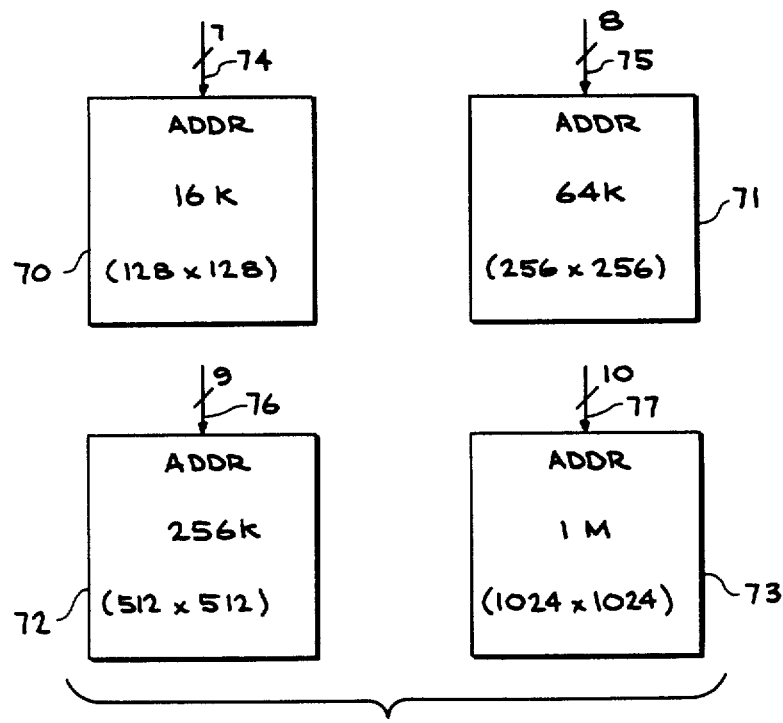
FIG. 6

FIG. 7 DISPLAY SCREEN

|   | 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|----|----|----|----|----|----|----|
| 0 | Aa | Ab | Ac | Ad | Ae | Af | Ag | Ah | Ai | Aj | Ak | Al | Am | An | Ao | Ap | Aq... |
| 1 | Ba | Bb | Bc | Bd | Be | Bf | Bg | Bh | Bi | Bj | Bk | Bl | Bm | Bn | Bo | Bp | Bq... |
| 2 | Ca | Cb | Cc | Cd | Ce | Cf | Cg | Ch | Ci | Cj | Ck | Cl | Cm | Cn | Co | Cp | Cq... |
| 3 | Da | Db | Dc | Dd | De | Df | Dg | Dh | Di | Dj | Dk | Dl | Dm | Dn | Do | Dp | Dq... |
| 4 | Ea | Eb | Ec | Ed | Ee | Ef | Eg | Eh | Ei | Ej | Ek | El | Em | En | Eo | Ep | Eq... |
| 5 | Fa | Fb | Fc | Fd | Fe | Ff | Fg | Fh | Fi | Fj | Fk | Fl | Fm | Fn | Fo | Fp | Fq... |
| 6 | Ga | Gb | Gc | Gd | Ge | Gf | Gg | Gh | Gi | Gj | Gk | Gl | Gm | Gn | Go | Gp | Gq... |
| 7 | Ha | Hb | Hc | Hd | He | Hf | Hg | Hh | Hi | Hj | Hk | Hl | Hm | Hn | Ho | Hp | Hq... |
| 8 | Ia | Ib | Ic | Id | Ie | If | Ig | Ih | Ii | Ij | Ik | Il | Im | In | Io | Ip | Iq... |
| 9 | Ja | Jb | Jc | Jd | Je | Jf | Jg | Jh | Ji | Jj | Jk | Jl | Jm | Jn | Jo | Jp | Jq... |
| 10 | Ka | Kb | Kc | Kd | Ke | Kf | Kg | Kh | Ki | Kj | Kk | Kl | Km | Kn | Ko | Kp | Kq... |
| 11 | La | Lb | Lc | Ld | Le | Lf | Lg | Lh | Li | Lj | Lk | Ll | Lm | Ln | Lo | Lp | Lq... |
| 12 | Ma | Mb | Mc | Md | Me | Mf | Mg | Mh | Mi | Mj | Mk | Ml | Mm | Mn | Mo | Mp | Mq... |
| 13 | Na | Nb | Nc | Nd | Ne | Nf | Ng | Nh | Ni | Nj | Nk | Nl | Nm | Nn | No | Np | Nq... |

| j 2 1 0 | TIME PERIOD | $\overline{RAS}/\overline{CAS}$ 7 6 5 4 3 2 1 0 | $\overline{RAS}$ EN1 |
|---|---|---|---|
| 0 0 0 | $t_1$ | 0 0 0 0 0 0 0 0 | 0 |
|  | $t_2$ | 0 0 0 0 0 0 0 0 | 0 |
| 0 0 1 | $t_1$ | 0 0 0 0 0 0 0 1 | 0 |
|  | $t_2$ | 0 0 0 0 0 0 0 0 | 0 |
| 0 1 0 | $t_1$ | 0 0 0 0 0 0 1 1 | 0 |
|  | $t_2$ | 0 0 0 0 0 0 0 0 | 0 |
| 0 1 1 | $t_1$ | 0 0 0 0 0 1 1 1 | 0 |
|  | $t_2$ | 0 0 0 0 0 0 0 0 | 0 |
| 1 0 0 | $t_1$ | 0 0 0 0 1 1 1 1 | 0 |
|  | $t_2$ | 0 0 0 0 0 0 0 0 | 0 |
| 1 0 1 | $t_1$ | 0 0 0 1 1 1 1 1 | 0 |
|  | $t_2$ | 0 0 0 0 0 0 0 0 | 0 |
| 1 1 0 | $t_1$ | 0 0 1 1 1 1 1 1 | 0 |
|  | $t_2$ | 0 0 0 0 0 0 0 0 | 0 |
| 1 1 1 | $t_1$ | 0 1 1 1 1 1 1 1 | 0 |
|  | $t_2$ | 0 0 0 0 0 0 0 0 | 0 |

FIG. 10 (NB$_y$ = 1)

| i 2 1 0 | TIME PERIOD | $\overline{RAS}/\overline{CAS}$ 7 6 5 4 3 2 1 0 | $\overline{CAS}$ EN1 |
|---|---|---|---|
| 0 0 0 | $t_3$ | 0 0 0 0 0 0 0 0 | 0 |
|  | $t_4$ | 0 0 0 0 0 0 0 0 | 0 |
| 0 0 1 | $t_3$ | 0 0 0 0 0 0 0 1 | 0 |
|  | $t_4$ | 0 0 0 0 0 0 0 0 | 0 |
| 0 1 0 | $t_3$ | 0 0 0 0 0 0 1 1 | 0 |
|  | $t_4$ | 0 0 0 0 0 0 0 0 | 0 |
| 0 1 1 | $t_3$ | 0 0 0 0 0 1 1 1 | 0 |
|  | $t_4$ | 0 0 0 0 0 0 0 0 | 0 |
| 1 0 0 | $t_3$ | 0 0 0 0 1 1 1 1 | 0 |
|  | $t_4$ | 0 0 0 0 0 0 0 0 | 0 |
| 1 0 1 | $t_3$ | 0 0 0 1 1 1 1 1 | 0 |
|  | $t_4$ | 0 0 0 0 0 0 0 0 | 0 |
| 1 1 0 | $t_3$ | 0 0 1 1 1 1 1 1 | 0 |
|  | $t_4$ | 0 0 0 0 0 0 0 0 | 0 |
| 1 1 1 | $t_3$ | 0 1 1 1 1 1 1 1 | 0 |
|  | $t_4$ | 0 0 0 0 0 0 0 0 | 0 |

FIG. 11 (NB$_x$ = 1)

| j 3 2 1 0 | TIME PERIOD | $\overline{RAS}/\overline{CAS}$ 7 6 5 4 3 2 1 0 | $\overline{RAS}$ $\overline{EN1}$ | $\overline{RAS}$ $\overline{EN2}$ |
|---|---|---|---|---|
| 0 0 0 0 | $t_1$ | 0 0 0 0 0 0 0 0 | 0 | 1 |
|  | $t_2$ | 1 1 1 1 1 1 1 1 | 1 | 0 |
| 0 0 0 1 | $t_1$ | 0 0 0 0 0 0 0 1 | 0 | 1 |
|  | $t_2$ | 1 1 1 1 1 1 1 0 | 1 | 0 |
| 0 0 1 0 | $t_1$ | 0 0 0 0 0 0 1 1 | 0 | 1 |
|  | $t_2$ | 1 1 1 1 1 1 0 0 | 1 | 0 |
| 0 0 1 1 | $t_1$ | 0 0 0 0 0 1 1 1 | 0 | 1 |
|  | $t_2$ | 1 1 1 1 1 0 0 0 | 1 | 0 |
| 0 1 0 0 | $t_1$ | 0 0 0 0 1 1 1 1 | 0 | 1 |
|  | $t_2$ | 1 1 1 1 0 0 0 0 | 1 | 0 |
| 0 1 0 1 | $t_1$ | 0 0 0 1 1 1 1 1 | 0 | 1 |
|  | $t_2$ | 1 1 1 0 0 0 0 0 | 1 | 0 |
| 0 1 1 0 | $t_1$ | 0 0 1 1 1 1 1 1 | 0 | 1 |
|  | $t_2$ | 1 1 0 0 0 0 0 0 | 1 | 0 |
| 0 1 1 1 | $t_1$ | 0 1 1 1 1 1 1 1 | 0 | 1 |
|  | $t_2$ | 1 0 0 0 0 0 0 0 | 1 | 0 |
| 1 0 0 0 | $t_1$ | 0 0 0 0 0 0 0 0 | 1 | 0 |
|  | $t_2$ | 1 1 1 1 1 1 1 1 | 0 | 1 |
| 1 0 0 1 | $t_1$ | 0 0 0 0 0 0 0 1 | 1 | 0 |
|  | $t_2$ | 1 1 1 1 1 1 1 0 | 0 | 1 |
| 1 0 1 0 | $t_1$ | 0 0 0 0 0 0 1 1 | 1 | 0 |
|  | $t_2$ | 1 1 1 1 1 1 0 0 | 0 | 1 |
| 1 0 1 1 | $t_1$ | 0 0 0 0 0 1 1 1 | 1 | 0 |
|  | $t_2$ | 1 1 1 1 1 0 0 0 | 0 | 1 |
| 1 1 0 0 | $t_1$ | 0 0 0 0 1 1 1 1 | 1 | 0 |
|  | $t_2$ | 1 1 1 1 0 0 0 0 | 0 | 1 |
| 1 1 0 1 | $t_1$ | 0 0 0 1 1 1 1 1 | 1 | 0 |
|  | $t_2$ | 1 1 1 0 0 0 0 0 | 0 | 1 |
| 1 1 1 0 | $t_1$ | 0 0 1 1 1 1 1 1 | 1 | 0 |
|  | $t_2$ | 1 1 0 0 0 0 0 0 | 0 | 1 |
| 1 1 1 1 | $t_1$ | 0 1 1 1 1 1 1 1 | 1 | 0 |
|  | $t_2$ | 1 0 0 0 0 0 0 0 | 0 | 1 |

FIG. 12 (NBY = 2)

| λ 3 2 1 0 | TIME PERIOD | RAS/CAS 7 6 5 4 3 2 1 0 | $\overline{CAS}$ $\overline{EN1}$ | $\overline{CAS}$ $\overline{EN2}$ |
|---|---|---|---|---|
| 0 0 0 0 | $t_3$ | 0 0 0 0 0 0 0 0 | 0 | 1 |
|  | $t_4$ | 1 1 1 1 1 1 1 1 | 1 | 0 |
| 0 0 0 1 | $t_3$ | 0 0 0 0 0 0 0 1 | 0 | 1 |
|  | $t_4$ | 1 1 1 1 1 1 1 0 | 1 | 0 |
| 0 0 1 0 | $t_3$ | 0 0 0 0 0 0 1 1 | 0 | 1 |
|  | $t_4$ | 1 1 1 1 1 1 0 0 | 1 | 0 |
| 0 0 1 1 | $t_3$ | 0 0 0 0 0 1 1 1 | 0 | 1 |
|  | $t_4$ | 1 1 1 1 1 0 0 0 | 1 | 0 |
| 0 1 0 0 | $t_3$ | 0 0 0 0 1 1 1 1 | 0 | 1 |
|  | $t_4$ | 1 1 1 1 0 0 0 0 | 1 | 0 |
| 0 1 0 1 | $t_3$ | 0 0 0 1 1 1 1 1 | 0 | 1 |
|  | $t_4$ | 1 1 1 0 0 0 0 0 | 1 | 0 |
| 0 1 1 0 | $t_3$ | 0 0 1 1 1 1 1 1 | 0 | 1 |
|  | $t_4$ | 1 1 0 0 0 0 0 0 | 1 | 0 |
| 0 1 1 1 | $t_3$ | 0 1 1 1 1 1 1 1 | 0 | 1 |
|  | $t_4$ | 1 0 0 0 0 0 0 0 | 1 | 0 |
| 1 0 0 0 | $t_3$ | 0 0 0 0 0 0 0 0 | 1 | 0 |
|  | $t_4$ | 1 1 1 1 1 1 1 1 | 0 | 1 |
| 1 0 0 1 | $t_3$ | 0 0 0 0 0 0 0 1 | 1 | 0 |
|  | $t_4$ | 1 1 1 1 1 1 1 0 | 0 | 1 |
| 1 0 1 0 | $t_3$ | 0 0 0 0 0 0 1 1 | 1 | 0 |
|  | $t_4$ | 1 1 1 1 1 1 0 0 | 0 | 1 |
| 1 0 1 1 | $t_3$ | 0 0 0 0 0 1 1 1 | 1 | 0 |
|  | $t_4$ | 1 1 1 1 1 0 0 0 | 0 | 1 |
| 1 1 0 0 | $t_3$ | 0 0 0 0 1 1 1 1 | 1 | 0 |
|  | $t_4$ | 1 1 1 1 0 0 0 0 | 0 | 1 |
| 1 1 0 1 | $t_3$ | 0 0 0 1 1 1 1 1 | 1 | 0 |
|  | $t_4$ | 1 1 1 0 0 0 0 0 | 0 | 1 |
| 1 1 1 0 | $t_3$ | 0 0 1 1 1 1 1 1 | 1 | 0 |
|  | $t_4$ | 1 1 0 0 0 0 0 0 | 0 | 1 |
| 1 1 1 1 | $t_3$ | 0 1 1 1 1 1 1 1 | 1 | 0 |
|  | $t_4$ | 1 0 0 0 0 0 0 0 | 0 | 1 |

FIG. 13 ($NB_X = 2$)

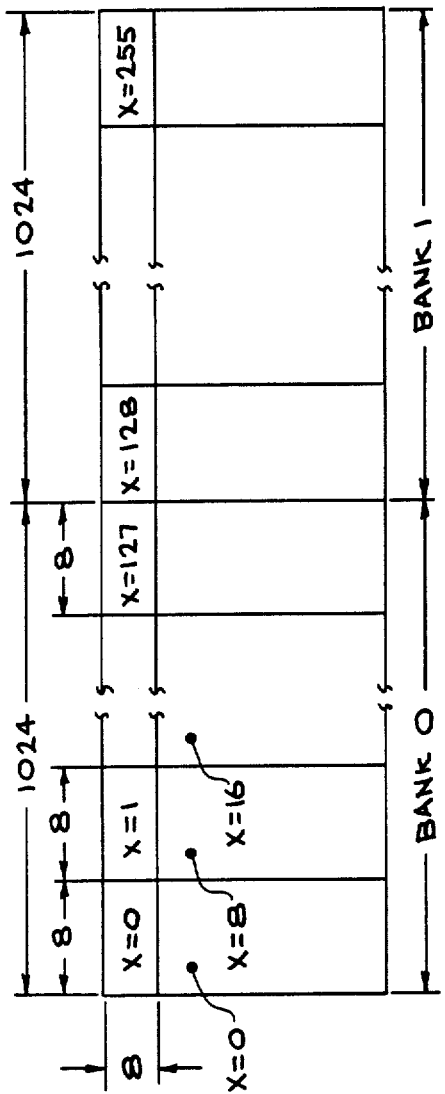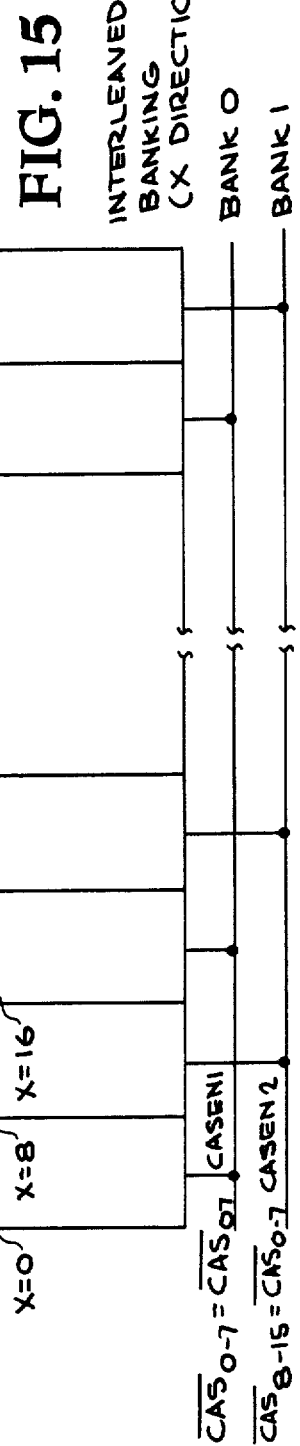

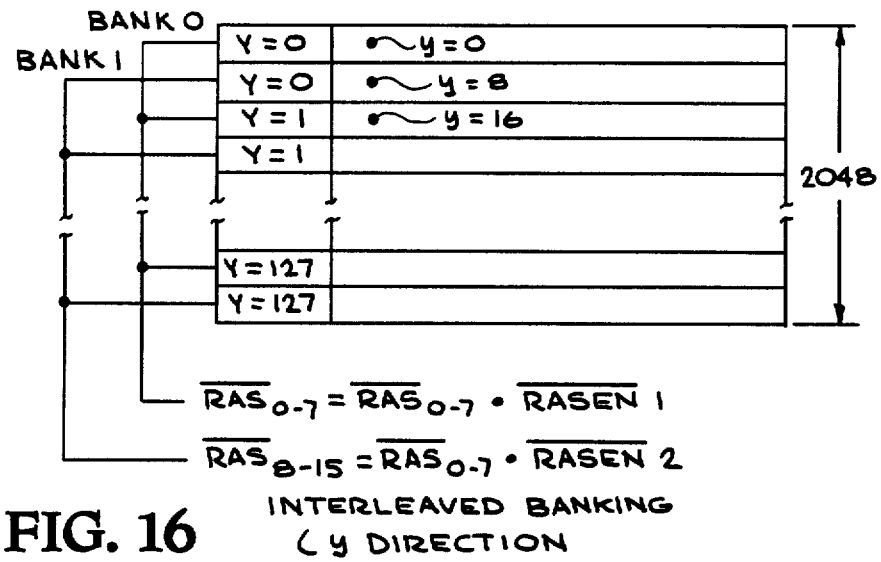
FIG. 16 INTERLEAVED BANKING (y DIRECTION)
FIG. 17 INTERLEAVED BANKING (BOTH X AND Y DIRECTION)
- ● BANK 00 USES $\overline{RASEN\ 1} \cdot \overline{CASEN\ 1}$
- ✳ BANK 01 USES $\overline{RASEN\ 1} \cdot \overline{CASEN\ 2}$
- △ BANK 10 USES $\overline{RASEN\ 2} \cdot \overline{CASEN\ 1}$
- □ BANK 11 USES $\overline{RASEN\ 2} \cdot \overline{CASEN\ 2}$

4,773,044

ARRAY-WORD-ORGANIZED DISPLAY MEMORY AND ADDRESS GENERATOR WITH TIME-MULTIPLEXED ADDRESS BUS

BACKGROUND OF THE INVENTION

1. Field of the Invention

The present invention relates in general to a display memory and an address generator for addressing the display memory and in particular to an array-word-organized display memory and an address generator with a time-multiplexed address bus for addressing word-aligned and non-word-aligned arrays of pixels in the display memory.

2. Description of Prior Art

Images are displayed on a display screen by scanning pixels in a display memory. To avoid flicker, updating a frame of pixels should be done in less than a typical frame time, e.g. 1/60 of a second. Hence, for a screen with 1K×1K pixels, the bandwidth required is approximately 60 megapixels/second.

In order to satisfy the above-described required bandwidth, it has been the practice to organize display memories by words wherein each word comprises a plurality of pixels.

Heretofore, one such type of display memory has comprised a plurality of words which are aligned along a scan line so that the video refresh controller could simply load each word in a shift register and shift them out as video data for the screen. On the other hand, in order to change the image appearing on the screen, a word of data was accessed and one or more pixels in the word were changed, each such access comprising a read and a write, requiring a minimum of two memory cycles.

A disadvantage of the above-described horizontally word-aligned organization was that, if the pixels to be updated crossed word boundaries, not only in a horizontal direction but also in a vertical direction, as in the case of vectors and characters, an unnecessarily high number of memory cycles were required to complete an update. For example, to load an 8×10 character that spans two words could take as many as 20 memory cycles instead of the 10 cycles required in the aligned case.

To at least partially overcome the disadvantages of horizontally word-aligned display memory organizations, word-array memory organizations have been proposed.

In an article entitled, A VSLI Architecture for Updating Raster-Scan Displays by S. Gupta and R. F. Sproull, Computer Graphics, Vol. 15, Number 3, August 1981, pp. 71–78, the authors disclose a display memory in which the pixels are organized in 8×8 arrays with each array comprising 64 pixels. In this organization, it is stated that an 8×10 character can be transferred in maximum 4 memory cycles.

In the apparatus proposed by Gupta et al, a plurality of 64 16-kilobit memory chips with each chip providing one of the pixels in an 8×8 array, a plurality of 8 address buses, each bus comprising 7 address lines, 8 $\overline{RAS}$ lines, 8 $\overline{CAS}$ lines and a graphics processor having two address outputs, are provided. The 64 chips may be considered as being arranged in 8 rows and 8 columns. One of the 8 address buses and one of the $\overline{CAS}$ lines is routed through each of the 8 columns of memory chips. One of the 8 $\overline{RAS}$ lines is routed through each of the 8 rows of memory chips. The 8 address buses are coupled to a pair of address outputs of the graphics processor. The $\overline{CAS}$ lines are coupled in parallel to a $\overline{CAS}$ strobe output of the graphics processor. The $\overline{RAS}$ lines are coupled to separate $\overline{RAS}$ strobe outputs of the graphics processor.

Assuming that the pixels in an arbitrary 8×8 pixel array fall within the boundaries of four 8×8 word-aligned arrays, that the address of the upper leftmost word-aligned array is X,Y, that the address of the array to the right of X,Y is X+1,Y, that the address of the array below X,Y is X,Y+1, and that the address of the pixels in the array to the right of X,Y+1 is X+1,Y+1, then the address of a pixel in the X,Y array is X*8+i,Y*8+j, where i is the number of pixels from the left edge of the word-aligned array X,Y and j is the number of pixels below the top edge of the word-aligned array X,Y.

To address the arbitrary array, wherein the upper leftmost pixel is located at (X*8+i,Y*8+j), takes three time periods. In the first time period, $t_1$, the address Y is placed on all of the 8 address buses and the $\overline{RAS}$ lines on the (8-j) rows from the bottom of the display memory array are strobed. In the second time period, $t_2$, the address Y+1 is placed on all of the 8 address buses and the $\overline{RAS}$ lines on the j rows from the top of the display memory are strobed. At this point, all of the chips have the correct Y address. In the third time period, the address X+1 is placed on the first (8-i) address buses of the display memory, the address X is placed on the rest of the i address buses of the display memory and the $\overline{CAS}$ lines to all of the memory chips are strobed. At this point, all of the chips have the correct X and X+1 addresses and the pixel data for the selected 8×8 unaligned-word-array is available.

While the above-described prior known array-word addressing scheme is advantageous in that it allows for addressing an arbitrary 8×8 word-array in three time periods, it also has a number of disadvantages. For example, the large number of conductors required between the graphics processor and the memory chips, e.g. 8 buses of 7 wires each for an 8×8 array of 16 kilobit chips, all of which carry identical information in the first and second memory cycles, is very difficult to fabricate because the conductors are so narrow and closely spaced. Moreover, as the size of the chips is increased the number of such conductors must also be increased, making the fabrication of the memory system even more difficult. For example, a 64 kilobit chip requires 8 address lines, a 256 kilobit chip requires 9 address lines, etc. Additionally, the graphics processor requires a special port dedicated to outputting the X+1 address at the same time as the X address, the scheme disallows partial X access to the 8×8 array thereby disallowing banking in the X direction, the size of the elementary array can't be changed dynamically from the original 8×8 array and the scheme disallows interleaved banking. The term "banking" as used here is a term defining the use of two distinct groups of 64 memory chips. "Interleaving" is a scheme that allows alternating arrays to belong to alternate banks. For example: array X,Y belongs to bank 0, array X+1,Y belongs to bank 1, array X+2Y belongs to bank 0, array X+3,Y belongs to bank 1, etc.

SUMMARY OF THE INVENTION

In view of the foregoing, principal objects of the present invention are a method and apparatus comprising an array-word-organized display memory system. In the system there is provided a graphics processor comprising an address generator for addressing a plurality of arbitrary arrays of pixels wherein each array is $AWS_x$ pixels wide and $AWS_y$ pixels long and a predetermined number of banks of memory chips, each of said banks comprising a plurality of rows and a plurality of columns of memory chips, each of said memory chips having a plurality of rows and a plurality of columns of pixels.

A single address bus in routed through all of the memory chips for addressing rows and columns of the pixels in the memory chips in a time-multiplexed manner. The row and column address of each pixel is designated by a pair of coordinates y and x. A plurality of $\overline{CAS}$ lines are provided wherein one of said $\overline{CAS}$ lines is routed through each one of said plurality of columns of memory chips. A plurality of $\overline{RAS}$ lines is provided wherein one of said $\overline{RAS}$ lines is routed through each one of said plurality of rows of memory chips.

In operation, a row address Y is applied to the address bus during a first time period $t_1$ for addressing a first predetermined row in each of said memory chips, where $$Y = \frac{y}{AWS_y \cdot NB_y},$$

and $NB_y$ is the number of said above-described banks of said memory chips in a y direction. After the address Y is applied to the address bus, the $\overline{RAS}$ lines in $AWS_y$-j rows of the memory chips are strobed during said first time period $t_1$, where j is equal to the remainder of $y/AWS_y$. If the most significant bit of remainder $(y/AWS_y \cdot NB_y)$ is equal to 0, then the $AWS_y$-j rows are associated with $\overline{RASEN1}$ and the remaining j rows are associated with $\overline{RASEN2}$. If the most significant bit of the remainder $y/AWS_y \cdot NB_y$ is equal to 2, then the $AWS_y$-j rows are associated with $\overline{RASEN2}$ and the j rows are associated with $\overline{RASEN1}$. Thereafter, a row address Y+1 is applied to the address bus during a second time period $t_2$ for addressing a second predetermined row in each of said chips and the $\overline{RAS}$ lines in the remainder of said rows of memory chips are strobed. In a third time period $t_3$, a column address X is applied to the address bus for addressing a first predetermined column in each of said memory chips, where $$X = \frac{x}{AWS_x \cdot NB_x},$$

and $NB_x$ is the number of said banks in an x direction. Within the same time period $t_3$, the $\overline{CAS}$ lines in $AWS_x$-i columns of said memory chips are strobed, where i corresponds to remainder $x/AWS_x$. If the most significant bit of remainder $x/AWS_x \cdot NB_x$ is equal to 0, then the $AWS_x$-i columns are associated with $\overline{CASEN1}$ and the i columns are associated with $\overline{CASEN2}$. If the most significant bit of remainder $x/AWS_x \cdot NB_x$ is equal to 1, then $AWS_x$-i columns are associated with $\overline{CASEN2}$ and the i columns are associated with $\overline{CASEN1}$. In a fourth time period $t_4$, a second column address X+1 is applied to the address bus for addressing a second predetermined column in each of said chips and within the same time period $t_4$, the $\overline{CAS}$ lines in the remainder of said columns of said memory chips are strobed.

In another embodiment of the present invention, there is provided multiple banks of memory chips which extend in an x and/or y direction for expanding the capacity of the memory system. In operation, the memory chips in each of the banks are addressed in an interleaved fashion.

By utilizing a single address bus which is routed through all of the memory chips instead of multiple address buses as heretofore used in prior known array-word-organized memory systems, problems associated with fabricating boards requiring large numbers of address lines are avoided. Also, a single port of the graphics processor is all that is required to supply all of the addresses to the chips, the array-word size can be changed dynamically, for example, from 8×8 to 4×4, and interleaved banking in both the x and y direction are readily possible.

BRIEF DESCRIPTION OF THE DRAWING

The above and other objects, features and advantages of the present invention will become apparent from the following detailed description of the accompanying drawing, in which:

FIG. 2 is a block diagram of the $\overline{RAS}/\overline{CAS}$ decoder of the apparatus of FIG. 1;

FIG. 3 is a block diagram of another embodiment of the present invention showing a pair of memory banks extending in a horizontal or x direction;

FIG. 4 is a block diagram of the $\overline{RAS}/\overline{CAS}$ decoder in the apparatus of FIG. 3;

FIG. 6 is a diagram of four different-sized memory chips which can be used with the apparatus of the present invention;

FIG. 7 is a diagram of a display screen according to the present invention;

FIGS. 10 and 11 are tables showing the $\overline{RAS}$ and $\overline{CAS}$ lines which are strobed during the time periods $t_1$-$t_4$ for addressing an arbitrary word-array when only a single bank of memory chips is being used;

FIGS. 12 and 13 are tables which show the $\overline{RAS}$ and $\overline{CAS}$ lines which are strobed during the time periods $t_1$-$t_4$ for addressing an arbitrary word-array when two banks of memory chips are used in an x direction and two banks of memory chips are used in the y direction, respectively;

FIG. 14 is a diagram of non-interleaved banking;

FIG. 15 is a diagram of interleaved banking in the x direction;

FIG. 16 is a diagram of interleaved banking in the y direction; and

FIG. 17 is a diagram of interleaved banking in both the x and y directions.

DETAILED DESCRIPTION OF THE DRAWING

Figure 1:
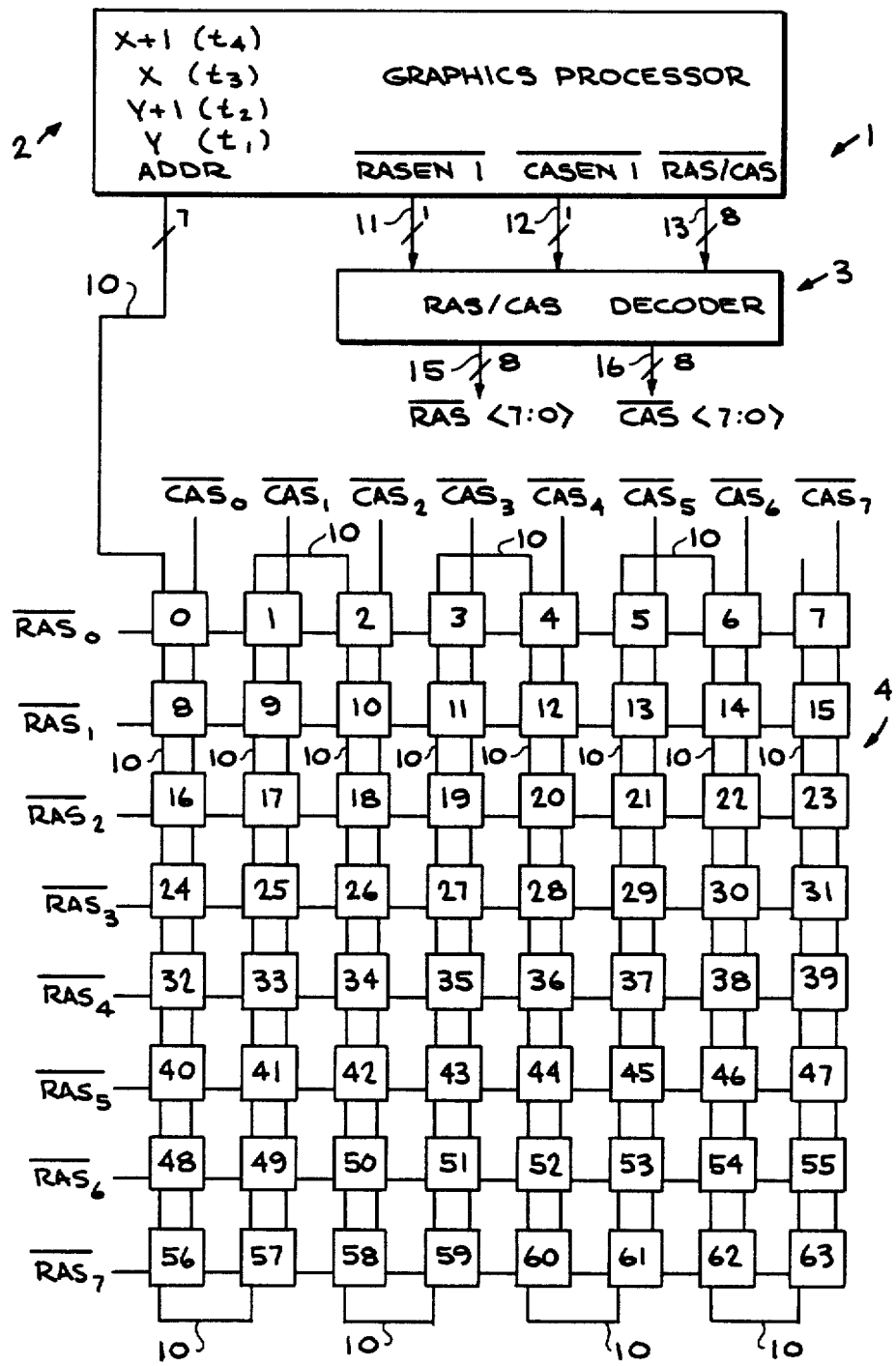
FIG. 1 is a block diagram of a single memory bank embodiment of the present invention.

Referring to FIG. 1, there is provided in accordance with the present invention an array-word-organized memory system designated generally as 1. In the system 1 there is provided a graphics processor 2, a $\overline{RAS}/\overline{CAS}$ decoder 3, and a single memory bank designated generally as 4. In the graphics processor 2 there is provided a time-multiplexed address output coupled to an address bus 10, a RAS enable control signal output ($\overline{RASEN1}$) coupled to a control signal line 11. A CAS enable control signal output ($\overline{CASEN}$) coupled to a control signal line 12 and a $\overline{RAS}/\overline{CAS}$ data output coupled to a $\overline{RAS}/\overline{CAS}$ data bus 13. In the embodiment of FIG. 1, the address bus 10 comprises seven address lines and the $\overline{RAS}/\overline{CAS}$ bus 13 comprises eight data lines. The lines 11 and 12 and bus 13 are coupled to inputs of the $\overline{RAS}/\overline{CAS}$ decoder 3.

In the $\overline{RAS}/\overline{CAS}$ decoder 3 there is provided a first output coupled to a $\overline{RAS}$ signal bus 15 and a second output coupled to a $\overline{CAS}$ signal bus 16. Each of the buses 15 and 16 comprises eight $\overline{RAS}$ and $\overline{CAS}$ lines, respectively.

In the memory bank 4 there is provided a plurality of 64 16-kbit memory chips. The address bus 10 is routed through all of the memory chips. Each of the eight $\overline{CAS}$ lines of the bus 16 is routed through one column of the memory chips. Similarly, each of the eight $\overline{RAS}$ lines of the bus 15 is routed through one row of the memory chips. For convenience, the $\overline{CAS}$ lines routed through each of the columns of memory chips are designated $\overline{CAS}_0$–$\overline{CAS}_7$, respectively. Similarly, the $\overline{RAS}$ lines routed through each of the rows of the memory chips are designated $\overline{RAS}_0$–$\overline{RAS}_7$, respectively.

Referring to FIG. 2, there is provided in the $\overline{RAS}/\overline{CAS}$ decoder 3 a pair of registers 20 and 21. In the register 20 there is provided a clock input coupled to a source of clock pulses by a clock signal line 22, an enable input $\overline{EN}$ coupled to the control signal line 11, eight data inputs coupled to the $\overline{RAS}/\overline{CAS}$ data bus 13 and a plurality of outputs $Q_0$–$Q_7$ coupled to the $\overline{RAS}$ lines $\overline{RAS}_0$–$\overline{RAS}_7$, respectively. Similarly, there is provided in the register 21 an input coupled to the source of clock pulses by means of a clock signal line 23, an enable input $\overline{EN}$ coupled to the control signal line 12, eight data inputs coupled to the $\overline{RAS}/\overline{CAS}$ data bus 13 and a plurality of outputs $Q_0$–$Q_7$ coupled to the $\overline{CAS}$ lines $\overline{CAS}_0$–$\overline{CAS}_7$, respectively.

Referring to FIG. 3, there is provided in another embodiment of the present invention, an array-word-organized memory system designated generally as 20. In the system 20 there is provided a graphics processor 21, a $\overline{RAS}/\overline{CAS}$ decoder 22 and a pair of memory banks 23 and 24 which are coupled in parallel to $\overline{RAS}_0$–$\overline{RAS}_7$ and extend in an x direction. In the processor 21 there is provided an address output coupled to a 7-line address bus 25, a $\overline{RAS}$ enable control signal output ($\overline{RASEN1}$) coupled to a control signal line 26, a first $\overline{CAS}$ enable control signal output ($\overline{CASEN1}$) coupled to a control signal line 27, a second $\overline{CAS}$ enable output ($\overline{CASEN2}$) coupled to a control signal line 28 and a $\overline{RAS}/\overline{CAS}$ data output $\overline{RAS}/\overline{CAS}$ coupled to an 8-line data bus 29.

In the $\overline{RAS}/\overline{CAS}$ decoder 22 there is provided inputs coupled to the control signal lines 26–28 and the data bus 29 and three outputs coupled to three $\overline{RAS}/\overline{CAS}$ buses 30, 31 and 32, respectively. Bus 30 comprises eight $\overline{RAS}$ lines designated $\overline{RAS}_0$–$\overline{RAS}_7$. Bus 31 comprises eight $\overline{CAS}$ lines designated $\overline{CAS}_0$–$\overline{CAS}_7$. Bus 32 comprises eight $\overline{CAS}$ lines designated $\overline{CAS}_8$–$\overline{CAS}_{15}$.

In each of the memory banks 23 and 24, as in memory bank 4, there is provided 64 16-kbit memory chips. The memory chips are arranged in eight rows and eight columns. Each of the $\overline{CAS}$ lines $\overline{CAS}_0$–$\overline{CAS}_7$ is routed through each of the columns of the memory chips in memory bank 23. Each of the $\overline{CAS}$ lines $\overline{CAS}_8$–$\overline{CAS}_{15}$ is routed through each of the columns of the memory chips in memory bank 24. Each of the $\overline{RAS}$ lines $\overline{RAS}_0$–$\overline{RAS}_7$ is routed through each of the rows of both memory banks 23 and 24.

Referring to FIG. 4, there is provided in the $\overline{RAS}/\overline{CAS}$ decoder 22 three registers 40, 41 and 42. In register 40 there is provided a clock input coupled to a source of clock pulses by means of a clock line 43, an enable input $\overline{EN}$ coupled to the bus 26 and eight data inputs coupled to the $\overline{RAS}/\overline{CAS}$ data bus 29 and a plurality of outputs $Q_0$–$Q_7$ coupled to the $\overline{RAS}$ lines $\overline{RAS}_0$–$\overline{RAS}_7$. In the register 41 there is provided a clock input coupled to the source of clock pulses by means of the line 43, an enable input $\overline{EN}$ coupled to the $\overline{CASEN1}$ control signal line 27, eight data inputs coupled to the $\overline{RAS}/\overline{CAS}$ data bus 29 and a plurality of outputs $Q_0$–$Q_7$ coupled to $\overline{CAS}$ lines $\overline{CAS}_0$–$\overline{CAS}_7$. In the register 42 there is provided a clock input coupled to the source of clock pulses by means of the clock signal line 43, an enable input $\overline{EN}$ coupled to the $\overline{CASEN2}$ control signal line 28, eight data inputs coupled to the $\overline{RAS}/\overline{CAS}$ data bus 29 and a plurality of outputs $Q_0$–$Q_7$ coupled to the $\overline{CAS}$ lines $\overline{CAS}_8$–$\overline{CAS}_{15}$.

Figure 5:
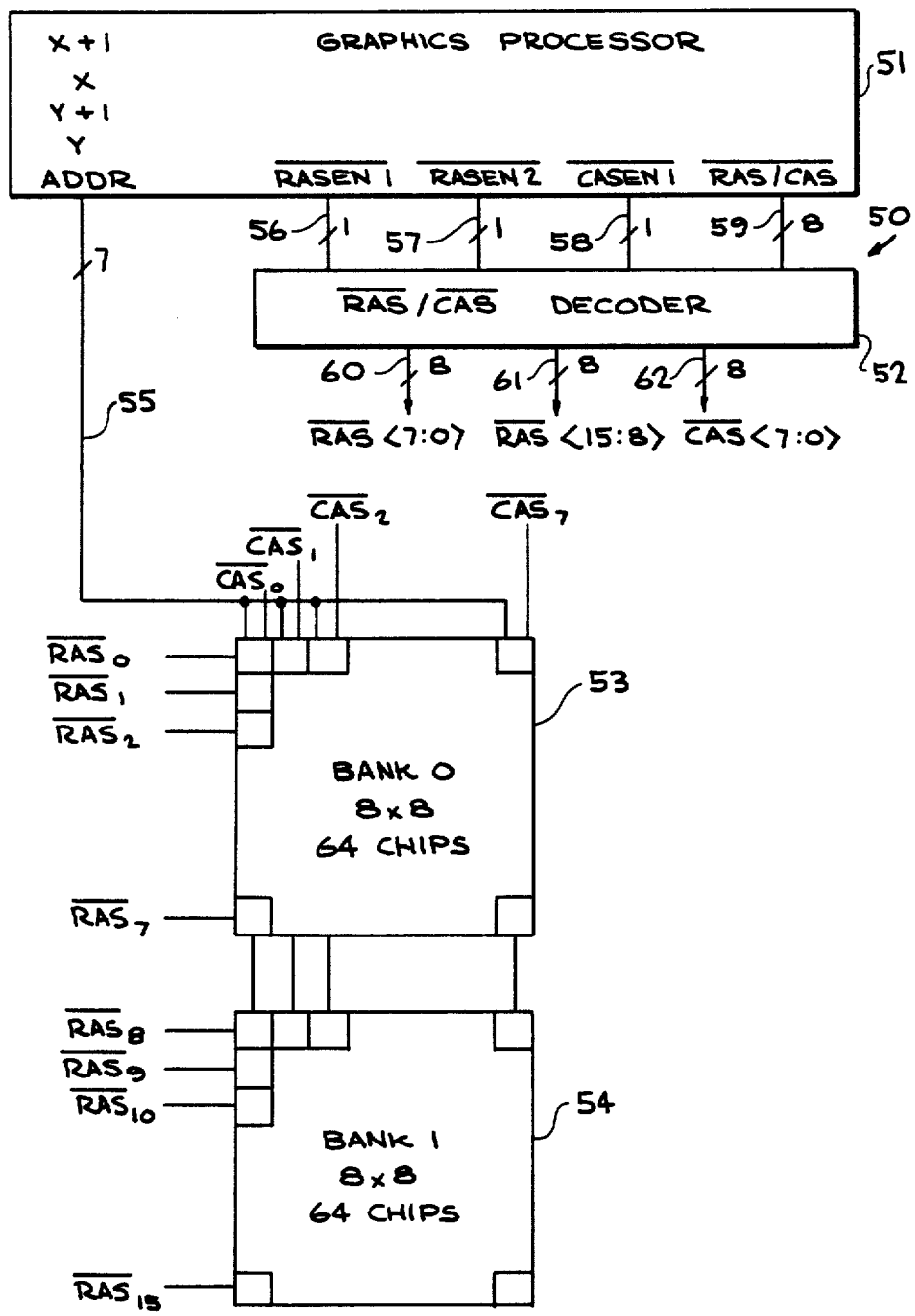
FIG. 5 is another embodiment of the present invention showing a pair of memory banks extending in a vertical or y direction.
Figure 8:
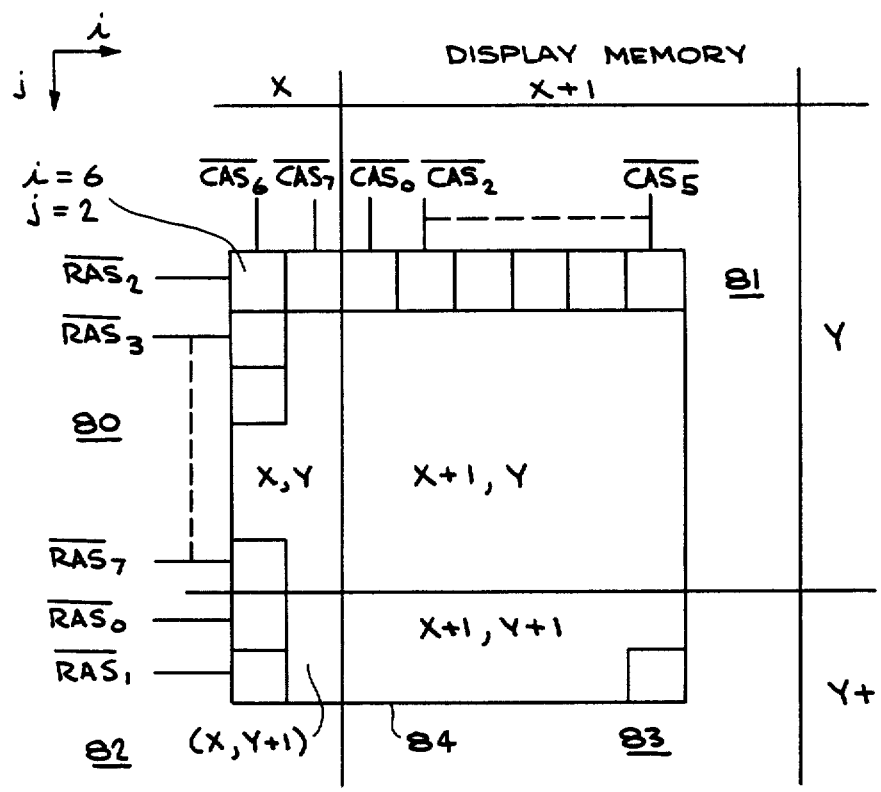
FIG. 8 is a diagram of a display memory showing an arbitrary array-word.

Referring to FIG. 5, there is provided in another embodiment of the present invention an array-word-organized memory system designated generally as 50. In the system 50 there is provided a graphics processor 51, a $\overline{RAS}/\overline{CAS}$ decoder 52 and a plurality of memory banks 53 and 54. In the graphics processor 51 there is provided an address output coupled to a 7-line address bus 55, an $\overline{RASEN1}$ control signal output coupled to a control signal line 56, an $\overline{RASEN2}$ control signal output coupled to a control signal line 57, a $\overline{CASEN1}$ control signal output coupled to a control signal line 58 and eight $\overline{RAS}/\overline{CAS}$ data outputs coupled to an 8-line data bus 59.

In the $\overline{RAS}/\overline{CAS}$ decoder 52 there is provided an input coupled to each of the control signal lines 56, 57 and 58, eight data inputs coupled to the data bus 59 and three 8-line output buses designated 60, 61 and 62, respectively. The lines in bus 60 are designated $\overline{RAS}_0$–$\overline{RAS}_7$. The lines in bus 61 are designated $\overline{RAS}_8$–$\overline{RAS}_{15}$ and the lines in bus 62 are designated $\overline{CAS}_0$–$\overline{CAS}_7$.

In the memory banks 53 and 54, one of the $\overline{CAS}$ lines $\overline{CAS}_0$–$\overline{CAS}_7$ is routed through each column of the memory banks 53 and 54. One of the $\overline{RAS}$ lines $\overline{RAS}_0$–$\overline{RAS}_7$ is routed through each of the rows of the memory bank 53. One of the $\overline{RAS}$ lines $\overline{RAS}_8$–$\overline{RAS}_{15}$ is routed through each of the rows of the memory bank 54.

Referring again to FIG. 4, there is provided in the $\overline{RAS}/\overline{CAS}$ decoder 52 three registers substantially identical to the registers 40–42 of FIG. 4 except that in the $\overline{RAS}/\overline{CAS}$ decoder 52 the register 42 has an enable input $\overline{EN}$ coupled to the $\overline{RASEN2}$ control signal line 57 and a plurality of $\overline{RAS}$ outputs $Q_0$–$Q_7$ coupled to $\overline{RAS}$ lines $\overline{RAS}_8$–$\overline{RAS}_{15}$.

Referring to FIG. 6, there is shown four memory chips 70, 71, 72 and 73. In memory chip 70 there is provided 16 k pixels which are organized in 128 rows and 128 columns. To address each of the pixels, there is provided a 7-bit address bus 74. In memory chip 71 there is provided 64 k pixels organized in 256 columns and 256 rows. To address the pixels in chip 71, there is provided an address bus 75 comprising eight address lines. In chip 72 there is provided 256 k pixels organized in 512 rows and 512 columns. To address chip 72, there is provided an address bus 76 comprising nine address lines. Similarly, in chip 73 there is provided one million pixels organized in 1024 rows and 1024 columns. To address the pixels in chip 73, there is provided an address bus 77 comprising ten address lines.

Each of the memory chips in the memory bank 4 of the apparatus of FIG. 1, the memory banks 23 and 24 of the apparatus of FIG. 3 and the memory banks 53 and 54 of the apparatus of FIG. 5 were described above as comprising a plurality of 16 k chips. For this reason, address buses 10, 25 and 55 were described above as each comprising seven address lines. As will become apparent, if larger size memory chips are required, such as memory chips 71, 72 or 73, the number of address lines in each of the address buses 10, 25 or 55 must correspond to the number of lines in the address buses 75, 76 and 77, respectively.

Referring to FIG. 7, there is shown a diagram of a portion of a display screen comprising a plurality of arrays of pixels 80, 81, 82, 83 and 84. Each of the arrays 80-84 comprises a 64-pixel word organized in rows and columns of eight pixels each. Arrays 80-83 are aligned arrays whereas 84 is an unaligned array. The upper case letters designate the row of the pixels. The lower case letters designate the columns of the pixels.

Referring again to FIG. 1, in operation each of the 64 memory chips in the memory bank 4, for convenience numbered 0-63, stores and provides one of the pixels in each of the arrays 80-83. For example, pixel Aa in array 80 is stored in bit 0 of chip 0. Pixel Ab is stored in bit 0 of chip 1. Pixel Ac is stored in bit 0 of chip 2. Pixel Ba is stored in bit 0 of chip 8. Pixel Ca is stored in bit 0 of chip 16. Bit Hh is stored in bit 0 of chip 3, etc. Similarly, each of the memory chips 0-63 stores and provides one of the pixels in the array 81. For example, pixel Ai is stored in bit 1 of chip 0. Pixel Aj is stored in bit 1 of chip 1. Pixel Ak is stored in bit 1 of chip 2. Pixel Bi is stored in bit 1 of chip 8. Pixel Ci is stored in bit 1 of chip 16. Pixel Hp is stored in bit 1 of chip 63, etc.

Since each 16k-bit chip comprises 128 rows and 128 columns of pixels, each such chip is addressed by means of a 7-bit pixel row address and a 7-bit pixel column address. For example, to address a particular one of the arrays 80-83, a 7-bit address X and a 7-bit address Y is applied in a time-multiplexed manner to all of the chips in the memory bank 4. For example, to address the pixels in the array 80, the addresses X=0 and Y=0 are applied to the chips 0-63. Since the addresses X=0 and Y=0 will address the bit 0 in each of the chips, all of the pixels in the array 80 will be addressed. Similarly, to address the pixels in array 81, the row address Y and the column address X+1 are applied to the memory chips 0-63. To address the pixels in array 82, the addresses X and Y+1 are applied to the memory chips 0-63. To address the pixels in array 83, the addresses X+1 and Y+1 are applied to the memory chips 0-63. In each of the above examples, X and Y are assumed to be 0. All of the $\overline{RAS}$ lines $\overline{RAS}_0$-$\overline{RAS}_7$ were strobed when the addresses Y and Y+1 were applied to the address lines and the $\overline{CAS}$ lines $\overline{CAS}_0$-$\overline{CAS}_7$ were strobed when the addresses X and X+1 were applied to the address lines.

In general, the addresses X and Y are integers which are generated in the graphics processor by the integer division of the row and column addresses x,y of a pixel on the screen by the product of a number corresponding to the size of the array in the horizontal and vertical direction and the number of banks of memory chips in the X and Y direction, as follows:

$$Y = \frac{y}{AWS_y \cdot NB_y} \text{ and}$$

$$X = \frac{y}{AWS_x \cdot NB_x} \text{ where}$$

$AWS_y$=the number of pixels in an array in the y direction, $AWS_x$=the number of pixels in an array in the x direction, $NB_y$=the number of memory banks in the y direction, and $NB_x$=the number of memory banks in the x direction Referring to FIG. 14, there is shown a diagram of non-interleaved banking. All of the pixels having an address x between 0-7 have a corresponding array address X=0. Similarly, all of the pixels having an address x between 8 and 15 have a corresponding array address X=1, etc.

Referring to FIG. 15, there is shown a diagram of interleaved banking. All of the pixels having addresses x between 0 and 15 have a corresponding array address X=0. Similarly, all of the pixels having an address x between 16 and 31 have a corresponding array address X=1, etc.

Referring to FIG. 16, there is shown a diagram of interleaved banking in the y direction. All of the pixels having addresses y between 0-15 have a corresponding array address Y=0. Similarly, all of the pixels having addresses y between 16-31 have a corresponding array address Y=1, etc.

Referring to FIG. 17, there is shown a diagram of interleaved banking in both the x and the y direction.

Referring to FIGS. 8-13 as well as FIG. 7, the arrays 80, 81, 82 and 83 are called word-aligned arrays because addresses x and y are integer multiples of $AWS_x$ and $AWS_y$, respectively. By means of the present invention, it is also possible to address the pixels in a non-word-aligned array which overlaps two or more word-aligned arrays. For example, in FIGS. 7 and 8 there is shown an array which overlaps the arrays addressed by the addresses (X,Y), (X+1,Y), X,Y+1) and (X+1, Y+1). In FIG. 7, the above-described non-aligned array is defined by the corner pixels Dg, Dn, Kg and Kn. For convenience, this array is designated by the number 84.

To address the array 84, it is necessary to generate the addresses X, Y, X+1 and Y+1, as well as to strobe selected ones of the $\overline{CAS}$ and $\overline{RAS}$ lines. The $\overline{CAS}$ and $\overline{RAS}$ lines which are strobed are set forth in the tables shown in FIGS. 10 and 11. It will also be appreciated that i and j comprise the remainder of the integer divisions described above with respect to the calculation of the addresses Y and X, as follows:

$$i = \text{remainder } \frac{x}{AWS_x \cdot NB_x} \text{ and}$$

$$j = \text{remainder } \frac{y}{AWS_y \cdot NB_y}$$

Figure 9:
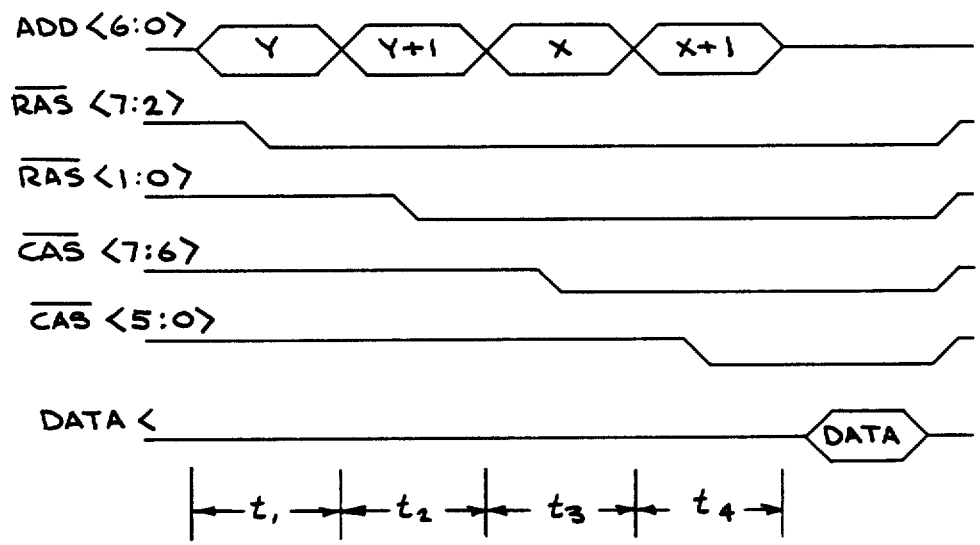
FIG. 9 is a timing diagram in accordance with the present invention.

For example, referring to FIG. 9, during a first time period $t_1$, the address Y is applied to the memory chips 0-63 and with j=2(010) $\overline{RASEN1}$ is enabled and $\overline{RAS}$ lines $\overline{RAS}_2$-$\overline{RAS}_7$ are strobed. During time period $t_2$, the address Y+1 is applied to the memory chips 0-63 and the $\overline{RAS}$ lines $\overline{RAS}_0$-$\overline{RAS}_1$ are strobed. During time period t₃, with i=6(110), the address X is applied to the memory chips 0-63, CASEN1 is enabled and $\overline{CAS}$ lines $\overline{CAS_6}$-$\overline{CAS_7}$ are strobed. During time period t₄, the address X+1 is applied to the memory chips 0-63 and CAS lines CAS₀-CAS₅ are strobed. From the foregoing, it can be seen that by applying the addresses X,Y, X+1 and Y+1 to the memory chips 0-63 in a time multiplexed manner in conjunction with the strobing of selected $\overline{RAS}$ and $\overline{CAS}$ lines, only those pixels in the array 84 will be selected.

In an alternative embodiment, j is an arbitrary number between 0 and AWS$_y$-1 and i is an arbitrary number between 0 and AWS$_x$-1.

Referring to FIGS. 12 and 13, there are shown, as described above with respect to FIGS. 10 and 11, tables of $\overline{RAS}$ and $\overline{CAS}$ lines which are strobed when a system comprises in the x and y direction two memory banks as shown in the apparatus of FIG. 3 and/or two memory banks as shown in the apparatus of FIG. 5, respectively.

The foregoing description of the preferred embodiment of the present invention have been presented for purposes of illustration and description. They are not intended to be exhaustive or to limit the invention to the precise form disclosed. Obviously, many modifications and variations will be apparent to practitioners skilled in this art. For example, the size of the pixel/word arrays in the x and y direction, i.e. AWS$_x$ and AWS$_y$, may be varied dynamically so long as the number of pixels in the x and y direction in each array is a power of 2. Similarly, the number of banks of memory chips in the x and y direction, i.e. NB$_x$ and NB$_y$ also may be changed, again so long as the number of banks comprises a power of 2. Moreover, within the above constraints, any size memory chip may be used for storing the pixels of an array so long as the number of address lines provided is sufficient for addressing each pixel in the array. In addition, by controlling the $\overline{CAS}$ lines with a control signal different from i, an array having less than AWS$_x$ columns can be addressed. By controlling the $\overline{RAS}$ lines with a control signal different from j, an array having less than AWS$_y$ rows can be addressed. In this way, subarrays of an array of AWS$_x$ by AWS$_y$ size can be addressed with the proposed system. Accordingly, it will be seen that the embodiments were chosen and described in order to best explain the principles of the invention and its practical application, thereby enabling others skilled in the art to understand the invention for various embodiments and with various modifications as are suited to the particular use contemplated. It is therefore intended that the scope of the invention be defined by the claims appended hereto and their equivalents.

What is claimed is:

1. An array-word-organized memory system including an addressing means for addressing a plurality of arbitrary arrays of pixels in said memory system wherein each array comprises a plurality of columns of pixels each AWS$_x$ pixels long and a plurality of rows of pixels each AWS$_y$ pixels long and y and x are, respectively, the row and column address of a pixel in the memory system comprising:

a predetermined number of banks of memory chips, each of said banks comprising a plurality of rows and a plurality of columns of memory chips, each of said memory chips having a plurality of rows and a plurality of columns of pixels;

an address bus routed through all of said memory chips;

a plurality of $\overline{CAS}$ lines wherein each one of said $\overline{CAS}$ lines is routed through each one of said plurality of columns of memory chips;

a plurality of $\overline{RAS}$ lines wherein each one of said $\overline{RAS}$ lines is routed through each one of said plurality of rows of memory chips;

means for applying a row address Y to said address bus during a time t₁ for addressing a first predetermined row of pixels in each of said memory chips, where $$Y = \frac{y}{AWS_y \cdot NB_y},$$

and NB$_y$ is the number of said banks of said memory chips in a y direction;

means for strobing said $\overline{RAS}$ lines in AWS$_y$-j rows of said memory chips during said time t₁ where $$j = \text{remainder } \frac{y}{AWS_y \cdot NB_y};$$

means for applying a row address Y+1 to said address bus during a time t₂ for addressing a second predetermined row of said pixels in each of said chips;

means for strobing said $\overline{RAS}$ lines in the remainder of said rows of said memory chips during said time t₂;

means for applying a column address X to said address bus during a time t₃ for addressing a first predetermined column of said pixels in each of said memory chips, where $$X = \frac{x}{AWS_x \cdot NB_x},$$

and NB$_x$ is the number of said banks in an x direction;

means for strobing said $\overline{CAS}$ lines in AWS$_x$-i columns of said memory chips during said time t₃, where $$i = \text{remainder } \frac{x}{AWS_x \cdot NB_x};$$

means for applying a column address X+1 to said address bus during a time t₄ for addressing a second predetermined column of said pixels in each of said chips; and means for strobing said $\overline{CAS}$ lines in the remainder of said columns of said memory chips during said time t₄.

2. A system according to claim 1 wherein each of the terms AWS$_x$, AWS$_y$, NB$_x$ and NB$_y$ is a number equal to a power of 2.

3. A system according to claim 2 wherein AWS$_x$=AWS$_y$=8 and NB$_x$=NB$_y$=1.

4. A system according to claim 2 wherein AWS$_x$=AWS$_y$=4 and NB$_x$=NB$_y$=1.

5. A system according to claim 2 wherein AWS$_x$=AWS$_y$=8, NB$_x$=2 and NB$_y$=1.

6. A system according to claim 2 wherein AWS$_x$=AWS$_y$=8, NB$_x$=1 and NB$_y$=2.

7. A system according to claim 1 wherein said plurality of $\overline{CAS}$ lines is equal in number to the product of AWS$_x$ and NB$_x$ and said plurality of $\overline{RAS}$ lines is equal in number to the product of AWS$_y$ and NB$_y$.

8. A system according to claim 1 wherein said $AWS_y$-j rows of said plurality of memory chips comprises the lower $AWS_y$-j rows of said plurality of rows of memory chips and said $AWS_x$-i columns of said plurality of memory chips comprises the rightmost $AWS_x$-i columns of said plurality of columns of memory chips.

9. A system according to claim 1 wherein said address bus comprises a predetermined number of address lines and said predetermined number of address lines corresponds to the number of pixels in each of said rows and each of said columns of pixels in each of said memory chips.

10. A system according to claim 9 wherein said number of pixels in each of said rows and each of said columns of pixels in each of said memory chips equals $2^n$, respectively, and said predetermined number of address lines in said address bus equals n.

11. A system according to claim 1 wherein each of said plurality of memory chips provides one pixel for each of said plurality of arrays of words.

12. A system according to claim 1 wherein the number of said memory chips in said plurality of memory chips is equal to the number of pixels in each of said arrays of pixels.

13. A system according to claim 1 wherein said means for strobing said $\overline{RAS}$ lines and said $\overline{CAS}$ lines comprises:

a $\overline{RAS}/\overline{CAS}$ decoder having a first input for receiving a $\overline{RAS}$ enable control signal $\overline{RASEN1}$, a second input for receiving a $\overline{RAS}$ enable control signal $\overline{RASEN2}$, a third input for receiving a $\overline{CAS}$ enable control signal $\overline{CASEN1}$, a fourth input for receiving a $\overline{CAS}$ enable control signal $\overline{CASEN2}$, a plurality of time multiplexed $\overline{RAS}$ and $\overline{CAS}$ strobe signals, a first output coupled to said $\overline{RAS}$ lines for providing to said $\overline{RAS}$ lines in response to said $\overline{RASEN1}$ control signal a first plurality of said $\overline{RAS}$ strobe signals during said time $t_1$ and a second plurality of said $\overline{RAS}$ strobe signals in response to said $\overline{RASEN2}$ control signal during said time $t_2$ and a second output coupled to said $\overline{CAS}$ lines for providing to said $\overline{CAS}$ lines in response to said $\overline{CASEN1}$ control signal a first plurality of $\overline{CAS}$ strobe signals during said time $t_3$ and a second plurality of $\overline{CAS}$ strobe signals during said time $t_4$ in response to said $\overline{CASEN2}$ control signal.

14. An array-word-organized memory system including an addressing means for addressing a plurality of arbitrary arrays of pixels in said memory system wherein each array comprises a plurality of columns of pixels each $AWS_x$ pixels long and a plurality of rows of pixels each $AWS_y$ pixels long and y and x are, respectively, the row and column address of a pixel in the memory system comprising:

a predetermined number of banks of memory chips, each of said banks comprising a plurality of rows and a plurality of columns of memory chips, each of said memory chips having a plurality of rows and a plurality of columns of pixels;

an address bus routed through all of said memory chips;

a plurality of $\overline{CAS}$ lines wherein each one of said $\overline{CAS}$ lines is routed through each one of said plurality of columns of memory chips;

a plurality of $\overline{RAS}$ lines wherein each one of said $\overline{RAS}$ lines is routed through each one of said plurality of rows of memory chips;

means for applying a row address Y to said address bus during a time $t_1$ for addressing a first predetermined row of pixels in each of said memory chips, where $$Y = \frac{y}{AWS_y \cdot NB_y}.$$

and $NB_y$ is the number of said banks of said memory chips in a y direction;

means for strobing said $\overline{RAS}$ lines in $AWS_y$-j rows of said memory chips during said time $t_1$ where j is an arbitrary number between 0 and $AWS_y$-1;

means for applying a row address Y+1 to said address bus during a time $t_2$ for addressing a second predetermined row of said pixels in each of said chips;

means for strobing said $\overline{RAS}$ lines in the remainder of said rows of said memory chips during said time $t_2$;

means for applying a column address X to said address bus during a time $t_3$ for addressing a first predetermined column of said pixels in each of said memory chips, where $$X = \frac{x}{AWS_x \cdot NB_x},$$

and $NB_x$ is the number of said banks in an x direction;

means for strobing said $\overline{CAS}$ lines in $AWS_x$-i columns of said memory chips during said time $t_3$, where i is an arbitrary number between 0 and $AWS_x$-1;

means for applying a column address X+1 to said address bus during a time $t_4$ for addressing a second predetermined column of said pixels in each of said chips; and means for strobing said $\overline{CAS}$ lines in the remainder of said columns of said memory chips during said time $t_4$.

15. A system according to claim 14 wherein each of the terms $AWS_x$, $AWS_y$, $NB_x$ and $NB_y$ is a number equal to a power of 2.

16. A system according to claim 15 wherein $AWS_x = AWS_y = 8$ and $NB_x = NB_y = 1$.

17. A system according to claim 15 wherein $AWS_x = AWS_y = 4$ and $NB_x = NB_y = 1$.

18. A system according to claim 15 wherein $AWS_x = AWS_y = 8$, $NB_x = 2$ and $NB_y = 1$.

19. A system according to claim 15 wherein $AWS_x = AWS_y = 8$, $NB_x = 1$ and $NB_y = 2$.

20. A system according to claim 14 wherein said plurality of $\overline{CAS}$ lines is equal in number to the product of $AWS_x$ and $NB_x$ and said plurality of $\overline{RAS}$ lines is equal in number to the product of $AWS_y$ and $NB_y$.

21. A system according to claim 14 wherein said $AWS_y$-j rows of said plurality of memory chips comprises the lower $AWS_y=j$ rows of said plurality of rows of memory chips and said $AWS_x$-i columns of said plurality of memory chips comprises the rightmost $AWS_x$-i columns of said plurality of columns of memory chips.

22. A system according to claim 14 wherein said address bus comprises a predetermined number of address lines and said predetermined number of address lines corresponds to the number of pixels in each of said rows and each of said columns of pixels in each of said memory chips.

23. A system according to claim 22 wherein said number of pixels in each of said rows and each of said columns of pixels in each of said memory chips equals $2^n$, respectively, and said predetermined number of address lines in said address bus equals n.

24. A system according to claim 14 wherein each of said plurality of memory chips provides one pixel for each of said plurality of arrays of words.

25. A system according to claim 14 wherein the number of said memory chips in said plurality of memory chips is equal to the number of pixels in each of said arrays of pixels.

26. A system according to claim 14 wherein said means for strobing said $\overline{RAS}$ lines and said $\overline{CAS}$ lines comprises:
a $\overline{RAS}/\overline{CAS}$ decoder having a first input for receiving a $\overline{RAS}$ enable control signal $\overline{RASEN1}$, a second input for receiving a $\overline{RAS}$ enable control signal $\overline{RASEN2}$, a third input for receiving a $\overline{CAS}$ enable control signal $\overline{CASEN1}$, a fourth input for receiving a $\overline{CAS}$ enable control signal $\overline{CASEN2}$, a plurality of time multiplexed RAS and $\overline{CAS}$ strobe signals, a first output coupled to said $\overline{RAS}$ lines for providing to said $\overline{RAS}$ lines in response to said $\overline{RASEN1}$ control signal a first plurality of said $\overline{RAS}$ strobe signals during said time $t_1$ and a second plurality of said $\overline{RAS}$ strobe signals in response to said $\overline{RASEN2}$ control signal during said time $t_2$ and a second output coupled to said $\overline{CAS}$ lines for providing to said $\overline{CAS}$ lines in response to said $\overline{CASEN1}$ control signal a first plurality of $\overline{CAS}$ strobe signals during said time $t_3$ and a second plurality of $\overline{CAS}$ strobe signals during said time $t_4$ in response to said $\overline{CASEN2}$ control signal.

27. A method of addressing an array-word-organized memory system having an addressing means for addressing a plurality of arbitrary arrays of pixels in said memory system wherein each array comprises a plurality of columns of pixels each $AWS_x$ pixels long and a plurality of rows of pixels each $AWS_y$ pixels long and y and x are, respectively, the row and column address of a pixel in the memory system, a predetermined number of banks of memory chips, each of said banks comprising a plurality of rows and a plurality of columns of memory chips, each of said memory chips having a plurality of rows and a plurality of columns of pixels, an address bus routed through all of said memory chips, a plurality of $\overline{CAS}$ lines wherein one of said $\overline{CAS}$ lines is routed through each one of said plurality of columns of memory chips and a plurality of $\overline{RAS}$ lines wherein one of said $\overline{RAS}$ lines is routed through each one of said plurality of rows of memory chips, comprising the steps of:
applying a row address Y to said address bus during a time $t_1$ for addressing a first predetermined row of pixels in each of said memory chips, where $$Y = \frac{y}{AWS_y \cdot NB_y}.$$

and $NB_y$ is the number of said banks of memory chips in a y direction;
strobing said $\overline{RAS}$ lines in $AWS_y$-j rows of said memory chips during said time $t_1$ where $$j = \text{remainder} \frac{y}{AWS_y \cdot NB_y};$$

applying a row address Y+1 to said address bus during a time $t_2$ for addressing a second predetermined row of said pixels in each of said chips;
strobing said $\overline{RAS}$ lines in the remainder of said rows of said memory chips during said time $t_2$;
applying a column address X to said address bus during a time $t_3$ for addressing a first predetermined column of said pixels in each of said memory chips, where $$X = \frac{x}{AWS_x \cdot NB_x}.$$

and $NB_x$ is the number of said banks in an x direction;
strobing said CAS lines in $AWS_x$-i columns of said memory chips during said time $t_3$, where $$i = \text{remainder} \frac{x}{AWS_x \cdot NB_x};$$

applying a column address X+1 to said address bus during a time $t_4$ for addressing a second predetermined column of said pixels in each of said chips; and
strobing said $\overline{CAS}$ lines in the remainder of said columns of said memory chips during said time $t_4$.

28. A method according to claim 27 wherein each of the terms $AWS_x$, $AWS_y$, $NB_x$ and $NB_y$ is a number equal to a power of 2.

29. A method according to claim 28 wherein $AWS_x = AWS_y = 8$ and $NB_x = NB_y = 1$.

30. A method according to claim 28 wherein $AWS_x = AWS_y = 4$ and $NB_x = NB_y = 1$.

31. A method according to claim 28 wherein $AWS_x = AWS_y = 8$, $NB_x = 2$ and $NB_y = 1$.

32. A method according to claim 28 wherein $AWS_x = AWS_y = 8$, $NB_x = 1$ and $NB_y = 2$.

33. A method according to claim 32 wherein said number of pixels in each of said rows and each of said columns of pixels in each of said memory chips equals $2^n$, respectively, and said predetermined number of address lines in said address bus equals n.

34. A method according to claim 27 wherein said plurality of $\overline{CAS}$ lines is equal in number to the product of $AWS_x$ and $NB_x$ and said pluralty of $\overline{RAS}$ lines is equal in number to the product of $AWS_y$ and $NB_y$.

35. A method according to claim 27 wherein said $AWS_y$-j rows of said plurality of memory chips comprises the lower $AWS_y$-j rows of said plurality of rows of memory chips and said $AWS_x$-i columns of said plurality of memory chips comprises the rightmost $AWS_x$-i columns of said plurality of columns of memory chips.

36. A method according to claim 27 wherein said address bus comprises a predetermined number of address lines and said predetermined number of address lines corresponds to the number of pixels in each of said rows and each of said columns of pixels in each of said memory chips.

37. A method according to claim 27 wherein each of said plurality of memory chips provides one pixel for each of said plurality of arrays of words.

38. A method according to claim 27 wherein the number of said memory chips in said plurality of memory chips is equal to the number of pixels in each of said arrays of pixels.

39. A method according to claim 27 wherein said steps of strobing said $\overline{RAS}$ lines and said $\overline{CAS}$ lines comprises the steps of:
provide a RAS/CAS decoder having a first input for receiving a RAS enable control signal RASEN1, a second input for receiving a RAS enable control signal RASEN2, a third input for receiving a CAS enable control signal CASEN1, a fourth input for receiving a CAS enable control signal CASEN2, a plurality of time multiplexed RAS and CAS strobe signals, a first output coupled to said $\overline{RAS}$ lines for providing to said $\overline{RAS}$ lines in response to said RASEN1 control signal a first plurality of said $\overline{RAS}$ strobe signals during said time $t_1$ and a second plurality of said $\overline{RAS}$ strobe signals in response to said RASEN2 control signal during said time $t_2$ and a second output coupled to said $\overline{CAS}$ lines for providing to said $\overline{CAS}$ lines in response to said CASEN1 control signal a first plurality of $\overline{CAS}$ strobe signals during said time $t_3$ and a second plurality of $\overline{CAS}$ strobe signals during said time $t_4$ in response to said CASEN2 control signal.

40. A method of addressing an array-word-organized memory system having an addressing means for addressing a plurality of arbitrary arrays of pixels in said memory system wherein each array comprises a plurality of columns of pixels each $AWS_x$ pixels long and a plurality of rows of pixels each $AWS_y$ pixels long and y and x are, respectively, the row and column address of a pixel in the memory system, a predetermined number of banks of memory chips, each of said banks comprising a plurality of rows and a plurality of columns of memory chips, each of said memory chips having a plurality of rows and a plurality of columns of pixels, an address bus routed through all of said memory chips, a plurality of $\overline{CAS}$ lines wherein one of said $\overline{CAS}$ lines is routed through each one of said plurality of columns of memory chips and a plurality of $\overline{RAS}$ lines wherein one of said $\overline{RAS}$ lines is routed through each one of said plurality of rows of memory chips, comprising the steps of:
applying a row address Y to said address bus during a time $t_1$ for addressing a first predetermined row of pixels in each of said memory chips, where $$Y = \frac{y}{AWS_y \cdot NB_y},$$

and $NB_y$ is the number of said banks of said memory chips in a y direction;
strobing said $\overline{RAS}$ lines in $AWS_y$-j rows of said memory chips during said time $t_1$ where j is an arbitrary number between 0 and $AWS_y$;
applying a row address Y+1 to said address bus during a time $t_2$ for addressing a second predetermined row of said pixels in each of said chips;
strobing said $\overline{RAS}$ lines in the remainder of said rows of said memory chips during said time $t_2$;
applying a column address X to said address bus during a time $t_3$ for addressing a first predetermined column of said pixels in each of said memory chips, where $$X = \frac{x}{AWS_x \cdot NB_x},$$

and $NB_x$ is the number of said banks in an x direction;
strobing said $\overline{CAS}$ lines in $AWS_x$-i columns of said memory chips during said time $t_3$, where i is an arbitrary number between 0 and $AWS_x$;
applying a column address X+1 to said address bus during a time $t_4$ for addressing a second predetermined column of said pixels in each of said chips; and
strobing said $\overline{CAS}$ lines in the remainder of said columns of said memory chips during said time $t_4$.

41. A method according to claim 40 wherein each of the terms $AWS_x$, $AWS_y$, $NB_x$ and $NB_y$ is a number equal to a power of 2.

42. A method according to claim 41 wherein $AWS_x = AWS_y = 8$ and $NB_x = NB_y = 1$.

43. A method according to claim 41 wherein $AWS_x = AWS_y = 4$ and $NB_x = NB_y = 1$.

44. A method according to claim 41 wherein $AWS_x = AWS_y = 8$, $NB_x = 2$ and $NB_y = 1$.

45. A method according to claim 41 wherein $AWS_x = AWS_y = 8$, $NB_x = 1$ and $NB_y = 2$.

46. A method according to claim 45 wherein said number of pixels in each of said rows and each of said columns of pixels in each of said memory chips equals $2^n$, respectively, and said predetermined number of address lines in said address bus equals n.

47. A method according to claim 40 wherein said plurality of $\overline{CAS}$ lines is equal in number to the product of $AWS_x$ and $NB_x$ and said plurality of $\overline{RAS}$ lines is equal in number to the product of $AWS_y$ and $NB_y$.

48. A method according to claim 40 wherein said $AWS_y$-j rows of said plurality of memory chips comprises the lower $AWS_y$-j rows of said plurality of rows of memory chips and said $AWS_x$-i columns of said plurality of memory chips comprises the rightmost $AWS_x$-i columns of said plurality of columns of memory chips.

49. A method according to claim 40 wherein said address bus comprises a predetermined number of address lines and said predetermined number of address lines corresponds to the number of pixels in each of said rows and each of said columns of pixels in each of said memory chips.

50. A method according to claim 40 wherein each of said plurality of memory chips provides one pixel for each of said plurality of arrays of words.

51. A method according to claim 40 wherein the number of said memory chips in said plurality of memory chips is equal to the number of pixels in each of said arrays of pixels.

52. A method according to claim 40 wherein said steps of strobing said $\overline{RAS}$ lines and said $\overline{CAS}$ lines comprises the steps of:
providing a $\overline{RAS}/\overline{CAS}$ decoder having a first input for receiving a $\overline{RAS}$ enable control signal RASEN1, a second input for receiving a $\overline{RAS}$ enable control signal RASEN2, a third input for receiving a $\overline{CAS}$ enable control signal $\overline{CASEN1}$, a fourth input for receiving a $\overline{CAS}$ enable control signal $\overline{CASEN2}$, a plurality of time multiplexed $\overline{RAS}$ and $\overline{CAS}$ strobe signals, a first output coupled to said $\overline{RAS}$ lines for providing to said $\overline{RAS}$ lines in response to said RASEN1 control signal a first plurality of said $\overline{RAS}$ strobe signals during said time $t_1$ and a second plurality of said $\overline{RAS}$ strobe signals in response to said $\overline{RASEN2}$ control signal during said time $t_2$ and a second output coupled to said $\overline{CAS}$ lines for providing to said $\overline{CAS}$ lines in response to said $\overline{CASEN1}$ control signal a first plurality of $\overline{CAS}$ strobe signals during said time $t_3$ and a second plurality of $\overline{CAS}$ strobe signals during said time $t_4$ in response to said $\overline{CASEN2}$ control signal.

* * * * *